(12) United States Patent
Lin

(10) Patent No.: US 11,886,109 B2
(45) Date of Patent: Jan. 30, 2024

(54) EUV PHOTO MASKS AND MANUFACTURING METHOD THEREOF

(71) Applicant: TAIWAN SEMICONDUCTOR MANUFACTURING COMPANY, LTD., Hsinchu (TW)

(72) Inventor: Yun-Yue Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/986,514

(22) Filed: Nov. 14, 2022

(65) Prior Publication Data

US 2023/0071118 A1 Mar. 9, 2023

Related U.S. Application Data

(63) Continuation of application No. 17/108,906, filed on Dec. 1, 2020, now Pat. No. 11,500,282.

(60) Provisional application No. 63/041,089, filed on Jun. 18, 2020.

(51) Int. Cl.
   *G03F 1/24* (2012.01)
(52) U.S. Cl.
   CPC ..................................... *G03F 1/24* (2013.01)
(58) Field of Classification Search
   CPC .......................................................... G03F 1/24
   USPC ............................................................ 430/5
   See application file for complete search history.

(56) References Cited

U.S. PATENT DOCUMENTS

| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 2020/0103742 | A1 | 4/2020 | Lee et al. |

FOREIGN PATENT DOCUMENTS

| CN | 109669318 A | 4/2019 |
| CN | 110837203 A | 2/2020 |
| TW | 201923441 A | 6/2019 |

OTHER PUBLICATIONS

Notice of Allowance issued in U.S. Appl. No. 17/108,906, dated Jul. 8, 2022.

*Primary Examiner* — Christopher G Young
(74) *Attorney, Agent, or Firm* — Studebaker & Brackett PC

(57) ABSTRACT

A reflective mask includes a substrate, a reflective multilayer disposed over the substrate, a capping layer disposed over the reflective multilayer, an intermediate layer disposed over the capping layer, an absorber layer disposed over the intermediate layer, and a cover layer disposed over the absorber layer. The absorber layer includes one or more layers of an Ir based material, a Pt based material or a Ru based material.

20 Claims, 14 Drawing Sheets

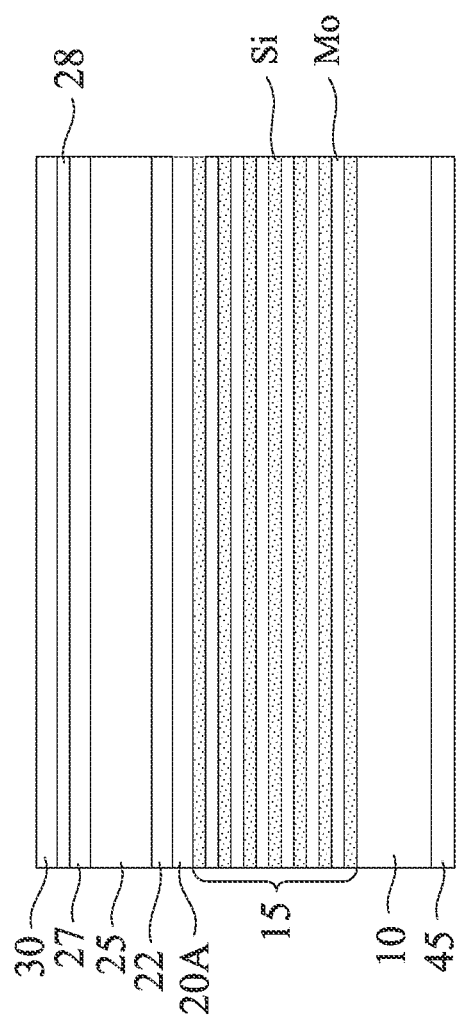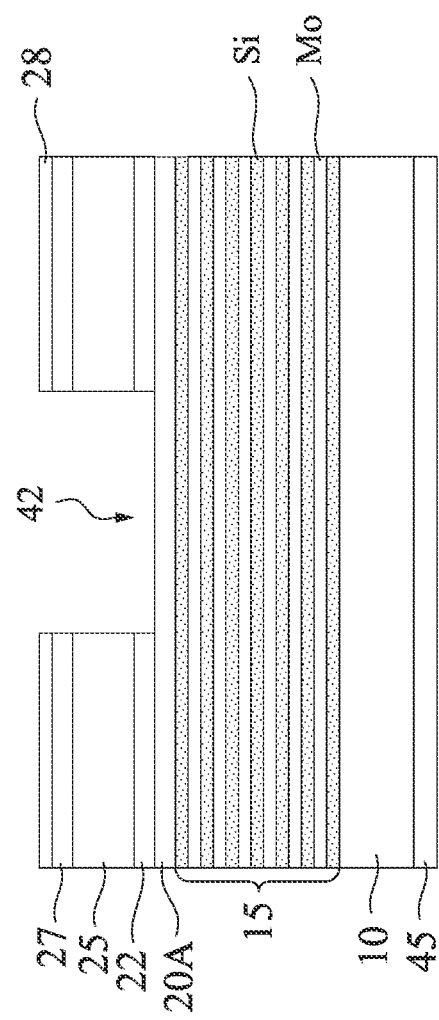

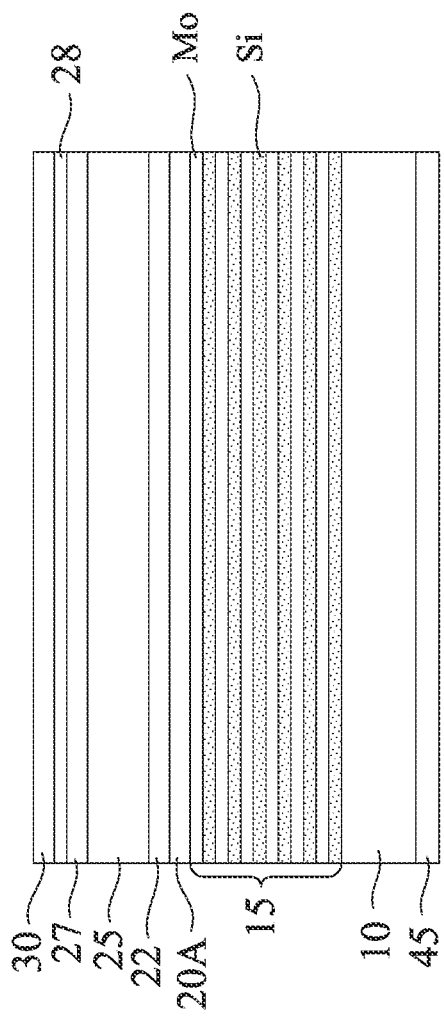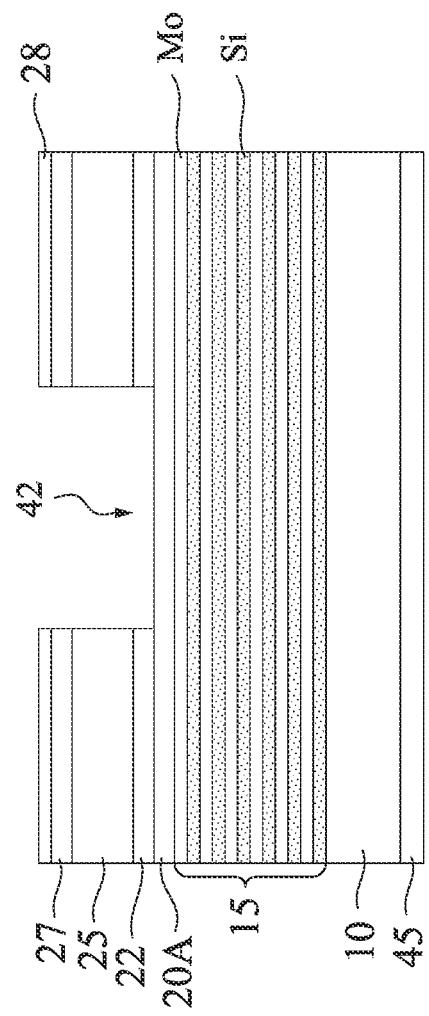

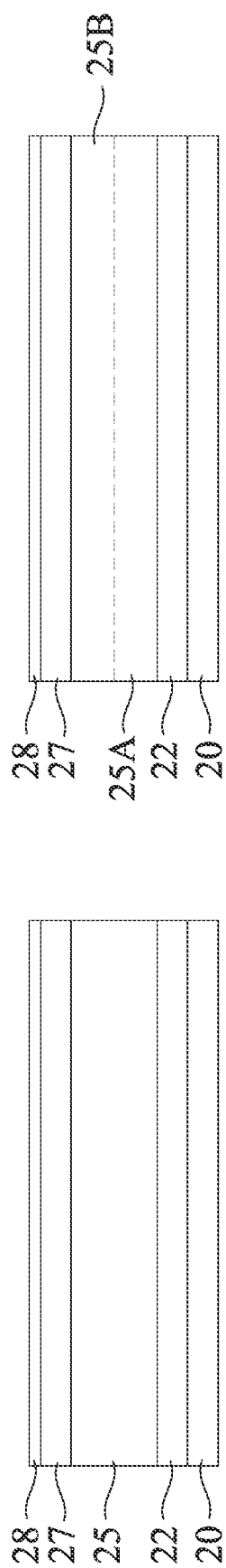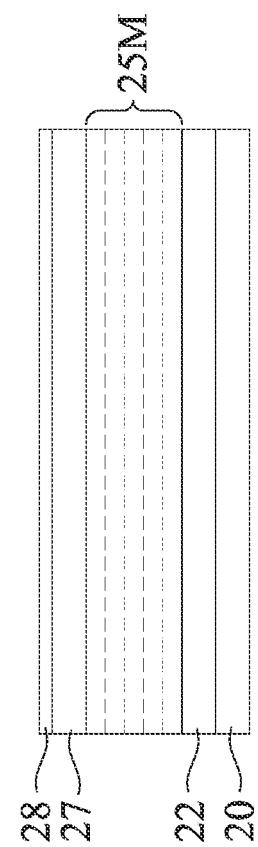

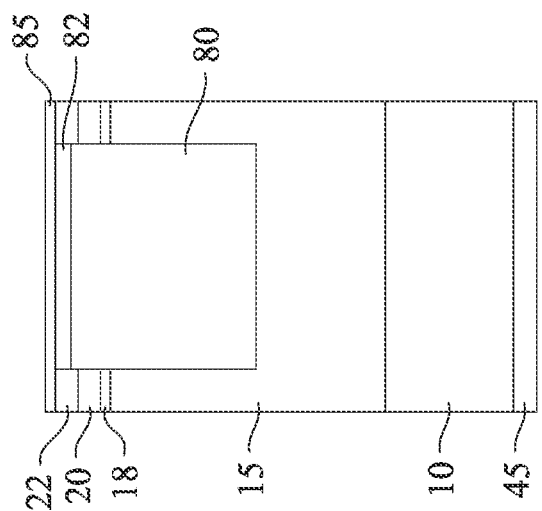
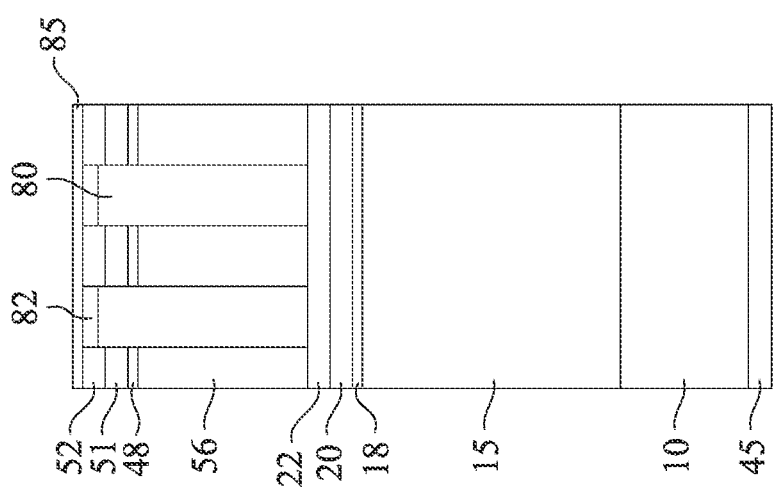
FIG. 9B
FIG. 9A

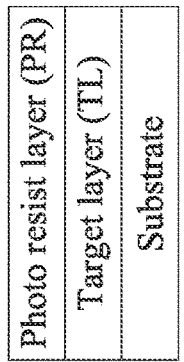
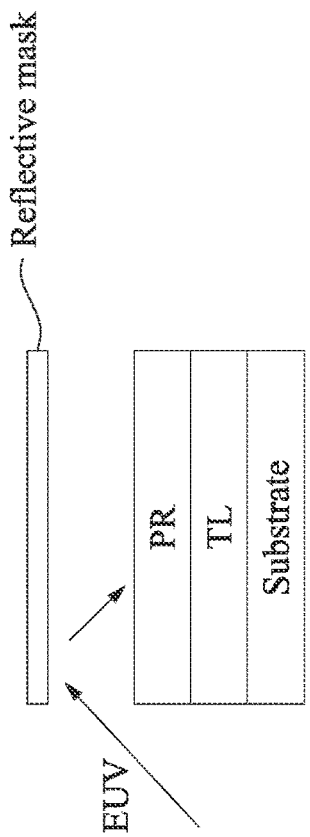
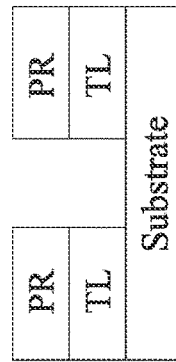
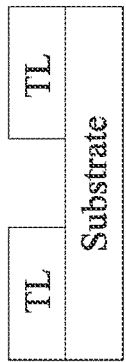
FIG. 14B
FIG. 14C
FIG. 14D
FIG. 14E
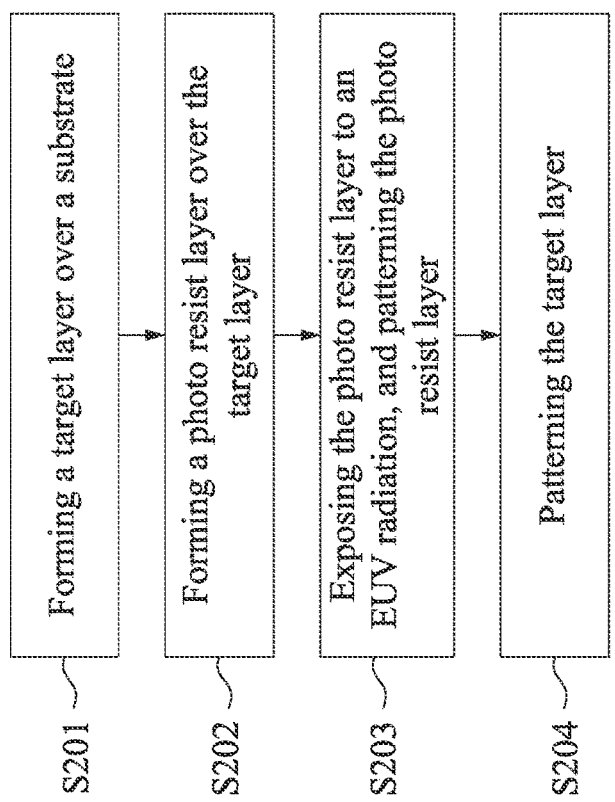
FIG. 14A

EUV PHOTO MASKS AND MANUFACTURING METHOD THEREOF

RELATED APPLICATION

This application is a continuation of U.S. patent application Ser. No. 17/108,906 filed Dec. 1, 2020, now U.S. Pat. No. 11,500,282, which claims priority to U.S. Provisional Patent Application No. 63/041,089 filed Jun. 18, 2020, the entire contents of each of which are incorporated herein by reference.

BACKGROUND

Photolithography operations are one of the key operations in the semiconductor manufacturing process. Photolithography techniques include ultraviolet lithography, deep ultraviolet lithography, and extreme ultraviolet lithography (EUVL). The photo mask is an important component in photolithography operations. It is critical to fabricate EUV photo masks having a high contrast with a high reflectivity part and a high absorption part.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4A shows a cross sectional view of a photo mask blank and FIG. 4B shows a cross sectional view of a photo mask according to embodiments of the present disclosure.

FIG. 5A shows a cross sectional view of a photo mask blank and FIG. 5B shows a cross sectional view of a photo mask according to embodiments of the present disclosure.

FIGS. 6A, 6B and 6C show cross sectional views of an absorber layer of a photo mask according to embodiments of the present disclosure.

FIGS. 9A and 9B schematically illustrate a method of fabricating an EUV photo mask according to an embodiment of the present disclosure.

FIG. 14A shows a flowchart of a method making a semiconductor device, and FIGS. 14B, 14C, 14D and 14E show a sequential manufacturing operation of a method of making a semiconductor device in accordance with embodiments of present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, processes and/or dimensions as explained with respect to one embodiment may be employed in other embodiments and detailed description thereof may be omitted.

Embodiments of the present disclosure provide a method of manufacturing an EUV photo mask. More specifically, the present disclosure provides techniques to prevent or suppress damage on a backside conductive layer of an EUV photo mask.

EUV lithography (EUVL) employs scanners using light in the extreme ultraviolet (EUV) region, having a wavelength of about 1 nm to about 100 nm, for example, 13.5 nm. The mask is a critical component of an EUVL system. Because the optical materials are not transparent to EUV radiation, EUV photo masks are reflective masks. Circuit patterns are formed in an absorber layer disposed over the reflective structure. The absorber layer has a low EUV reflectivity, for example, less than 3-5%. The present disclosure provides an EUV reflective photo mask having a low reflective (high absorbing) absorber structure.

Figure 1A:
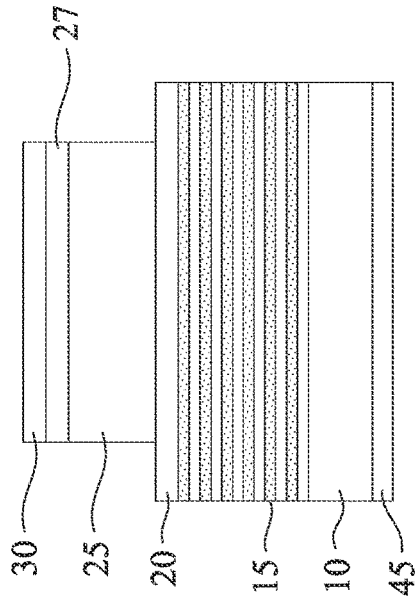
FIGS. 1A, 1B, 1C and 1D show EUV photo mask blanks according to embodiments of the present disclosure.
Figure 1C:
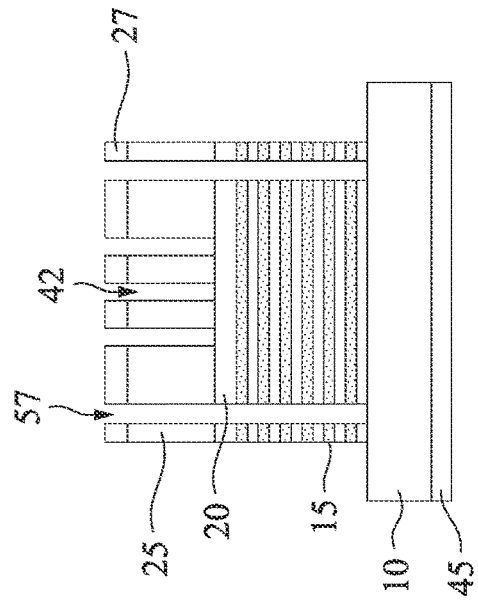
Figure 1B:
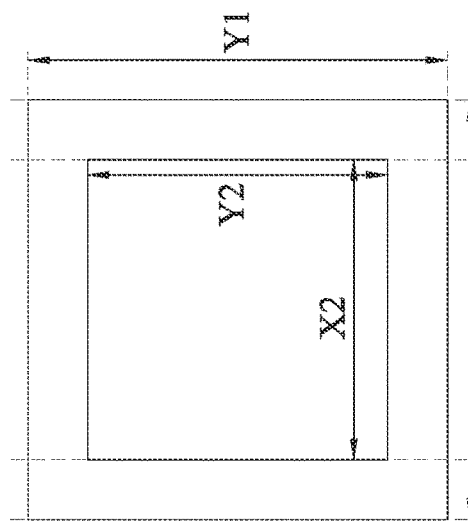
Figure 1D:
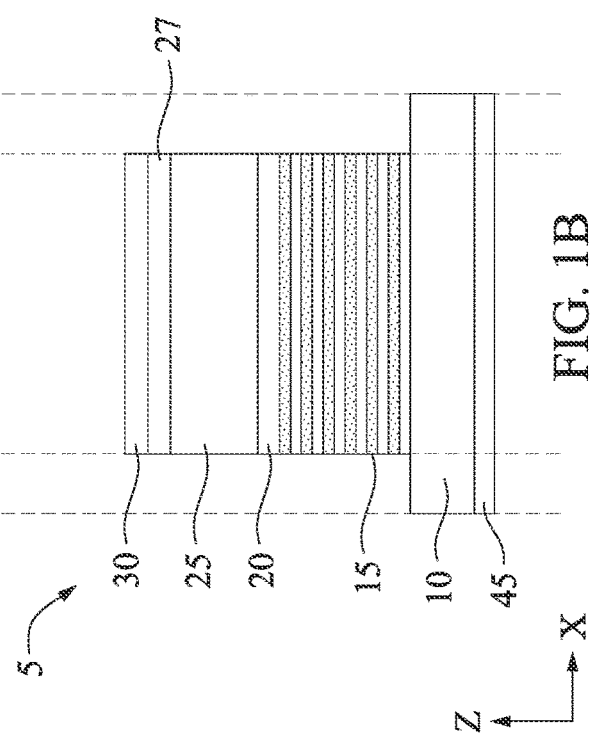

FIGS. 1A and 1B show an EUV reflective photo mask blank according to an embodiment of the present disclosure. FIG. 1D shows a patterned EUV reflective photo mask ready for use in EUV lithography. FIG. 1A is a plan view (viewed from the top) and FIG. 1B is a cross sectional view along the X direction. Some of the layers described with respect to the following embodiments are not shown in FIGS. 1A-1D.

In some embodiments, the EUV photo mask with circuit patterns is formed from an EUV photo mask blank 5. The EUV photo mask blank 5 includes a substrate 10, a multi-layer Mo/Si stack 15 of multiple alternating layers of silicon and molybdenum, a capping layer 20, an absorber layer 25, a cover (or antireflective) layer 27 and a hard mask layer 30. Further, a backside conductive layer 45 is formed on the backside of the substrate 10, as shown in FIG. 1B.

The substrate 10 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the size X1×Y1 of the substrate 10 is about 152 mm×about 152 mm having a thickness of about 20 mm. In other embodiments, the size of the substrate 10 is smaller than 152 mm×152 mm and equal to or greater than 148 mm×148 mm. The shape of the substrate 10 is square or rectangular in some embodiments.

In some embodiments, the functional layers above the substrate (the multilayer Mo/Si stack 15, the capping layer 20, the absorber layer 25, the cover layer 27 and the hard mask layer 30) have a smaller width than the substrate 10. In some embodiments, the size X2×Y2 of the functional layers is in a range from about 138 mm×138 mm to 142 mm×142 mm. The shape of the functional layers is square or rectangular in some embodiments.

In other embodiments, the absorber layer 25, the cover layer 27 and the hard mask layer 30 have a smaller size in the range from about 138 mm×138 mm to about 142 mm×142 mm than the substrate 10, the multilayer Mo/Si stack 15 and the capping layer 20 as shown in FIG. 1C. The smaller size of one or more of the functional layers can be formed by using a frame shaped cover having an opening in a range from about 138 mm×138 mm to about 142 mm×142 mm, when forming the respective layers by, for example, sputtering. In other embodiments, all of the layers above the substrate 10 have the same size as the substrate 10.

In some embodiments, the Mo/Si multilayer stack 15 includes from about 30 alternating pairs of silicon and molybdenum layers to about 60 alternating pairs of silicon and molybdenum layers. In certain embodiments, from about 40 to about 50 alternating pairs of silicon and molybdenum layers are formed. In some embodiments, the reflectivity is higher than about 70% for the wavelengths of interest e.g., 13.5 nm. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each silicon layer is about 4 nm and the thickness of each molybdenum layer is about 3 nm. In some embodiments, the bottommost layer of the multilayer stack 15 is a Si layer or a Mo layer.

In other embodiments, the multilayer stack 15 includes alternating molybdenum layers and beryllium layers. In some embodiments, the number of layers in the multilayer stack 15 is in a range from about 20 to about 100 although any number of layers is allowed as long as sufficient reflectivity is maintained for imaging the target substrate. In some embodiments, the reflectivity is higher than about 70% for the wavelengths of interest e.g., 13.5 nm. In some embodiments, the multilayer stack 15 includes about 30 to about 60 alternating layers of Mo and Be. In other embodiments of the present disclosure, the multilayer stack 15 includes about 40 to about 50 alternating layers each of Mo and Be.

The capping layer 20 is disposed over the Mo/Si multilayer stack 15 to prevent oxidation of the multilayer stack 15 in some embodiments. In some embodiments, the capping layer 20 is made of elemental ruthenium (more than 99% Ru, not a Ru compound), a ruthenium alloy (e.g., RuNb, RuZr, RuZrN, RuRh, RuNbN, RuRhN, RuV, RuVN, RuIr, RuTi, RuB, RuP, RuOs, RuPd RuPt or RuRe) or a ruthenium based oxide (e.g., $RuO_2$, RuNbO, RiVO or RuON), having a thickness of from about 2 nm to about 10 nm. In some embodiments, the capping layer 20 is a ruthenium compound $Ru_xM_{1-x}$, where M is one or more of Nb, Jr, Rh, Zr, Ti, B, P, V, Os, Pd, Pt or Re, and x is more than zero and equal to or less than about 0.5

In certain embodiments, the thickness of the capping layer 20 is from about 2 nm to about 5 nm. In some embodiments, the capping layer 20 has a thickness of 3.5 nm±10%. In some embodiments, the capping layer 20 is formed by chemical vapor deposition, plasma-enhanced chemical vapor deposition, atomic layer deposition, physical vapor deposition (e.g., sputtering), or any other suitable film forming method. In other embodiments, a Si layer is used as the capping layer 20. One or more layers are disposed between the capping layer and the multilayer 15 as set forth below in some embodiments.

In some embodiments, the capping layer 20 includes two or more layers of different materials. In some embodiments, the capping layer 20 includes two or more layers of different Ru based materials. In some embodiments, the capping layer 20 includes two layers having a lower layer and an upper layer, and the upper layer has a higher carbon absorption resistance than the lower layer, and the lower layer has a higher etching resistance during the absorber etching. In certain embodiments, the capping layer 20 includes a RuNb based layer (RuNb or RuNbN) disposed on a RuRh based layer (RuRh or RuRhN).

The absorber layer 25 is disposed over the capping layer 20. The absorber layer includes a high EUV absorption material having a k value more than about 0.03 or more than about 0.045. In some embodiments, the absorber layer 25 is Ta based material. In some embodiments, the absorber layer 25 is made of TaN, TaO, TaB, TaBO or TaBN. In other embodiments, the absorber layer 25 includes a Cr based material, such as CrN, CrBN, CrO and/or CrON. In some embodiments, the absorber layer 25 has a multilayered structure of Cr, CrO or CrON. In some embodiments, the absorber layer is Ir or an Ir based material, such as, IrRu, IrPt, IrN, IrAl, IrSi or IrTi. In some embodiments, the absorber layer is a Ru based material, such as, IrRu, RuPt, RuN, RuAl, RuSi or RuTi, or a Pt based material, PtIr, RuPt, PtN, PtAl, PtSi or PtTi. In other embodiments, the absorber layer includes an Os based material, a Pd based material, or a Re based material. In some embodiments of the present disclosure, an X based material means that an amount of X is equal to or more than 50 atomic %.

In other embodiments, the absorber layer material is represented by $A_xB_y$, where A and B are each one or more of Ir, Pt, Ru, Cr, Ta, Os, Pd, Al or Re, and x:y is from about 0.25:1 to about 4:1. In some embodiments, x is different from y (smaller or larger). In some embodiments, the absorber layer further includes one or more of Si, B, or N in an amount of more than zero to about 10 atomic %.

In some embodiments, the thickness of the absorber layer 25 ranges from about 25 nm to about 100 nm, and ranges from about 50 nm to about 75 nm in other embodiments. In some embodiments, the absorber layer 25 is formed by chemical vapor deposition, plasma-enhanced chemical vapor deposition, atomic layer deposition, physical vapor deposition, or any other suitable film forming method. One or more layers are disposed between the capping layer 20 and the absorber layer 25 as set forth below in some embodiments.

In some embodiments, a cover or antireflective layer 27 is disposed over the absorber layer 25. In some embodiments, the cover layer 27 includes a Ta based material, such as TaB, TaO or TaBO, silicon, a silicon based compound (e.g., silicon oxide, SiN, SiON or MoSi), ruthenium, or a ruthenium based compound (Ru or RuB). In certain embodiments, the cover layer 27 is made of tantalum oxide ($Ta_2O_5$ or non-stoichiometric (e.g., oxygen deficient) tantalum oxide), and has a thickness of from about 2 nm to about 20 nm. In other embodiments, a TaBO layer having a thickness in a range from about 2 nm to about 20 nm is used as the cover layer. In some embodiments, the thickness of the cover layer 27 is from about 2 nm to about 5 nm. In some embodiments, the cover layer 27 is formed by chemical vapor deposition, plasma-enhanced chemical vapor deposition, atomic layer deposition, physical vapor deposition, or any other suitable film forming method.

Figure 2A:
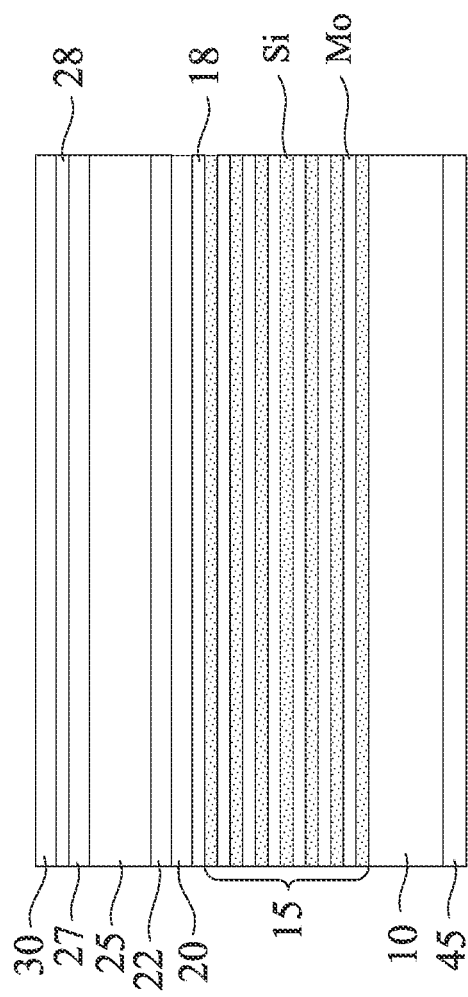
FIG. 2A shows a cross sectional view of a photo mask blank and FIG. 2B shows a cross sectional view of a photo mask according to embodiments of the present disclosure.
Figure 2B:
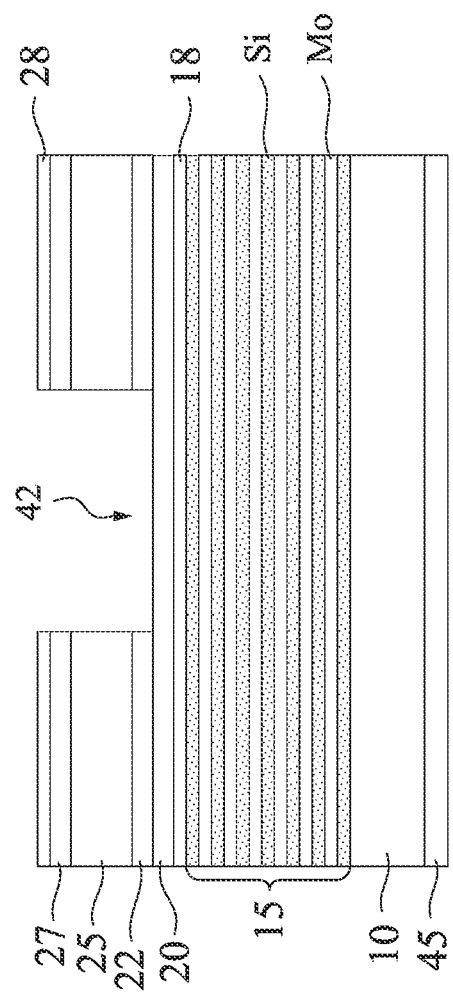

Further, in some embodiments, a protection layer 28 is formed over the cover layer 27 (see, FIGS. 2A and 2B). The protection layer 28 includes a silicon compound, such as silicon oxide, silicon nitride, SiON, SiOCN or MoSiN. In other embodiments, the protection layer 28 includes BN or BC. In some embodiments, the thickness of the protection layer 28 is from about 0.5 nm to about 5 nm and is from about 1 nm to about 3 nm in other embodiments.

The hard mask layer 30 is disposed over the protection layer 28 in some embodiments. In some embodiments, the hard mask layer 30 is made of a Cr based material, such as CrO, CrON or CrCON, when the absorber layer 25 is made of a Ta based material. In other embodiments, the hard mask layer 30 is made of a Ta based material, such as TaB, TaO, TaBO or TaBN, when the absorber layer 25 is made of a Cr based material. In other embodiments, the hard mask layer 30 is made of silicon, a silicon based compound (e.g., SiN or SiON), ruthenium or a ruthenium based compound (Ru or RuB). The hard mask layer 30 has a thickness of about 4 nm to about 20 nm in some embodiments. In some embodiments, the hard mask layer 30 includes two or more different material layers. In some embodiments, the hard mask layer 30 is formed by chemical vapor deposition, plasma-enhanced chemical vapor deposition, atomic layer deposition, physical vapor deposition, or any other suitable film forming method.

In some embodiments, the backside conductive layer 45 is disposed on a second main surface of the substrate 10 opposing the first main surface of the substrate 10 on which the Mo/Si multilayer stack 15 is formed. In some embodiments, the backside conductive layer 45 is made of TaB (tantalum boride) or other Ta based conductive material. In some embodiments, the tantalum boride is crystalline. The crystalline tantalum boride includes TaB, $Ta_5B_6$, $Ta_3B_4$ and $TaB_2$. In other embodiments, the tantalum boride is poly crystalline or amorphous. In other embodiments, the backside conductive layer 45 is made of a Cr based conductive material (CrN or CrON). In some embodiments, the sheet resistance of the backside conductive layer 45 is equal to or smaller than 20Ω/□. In certain embodiments, the sheet resistance of the backside conductive layer 45 is equal to or more than 0.1Ω/□. In some embodiments, the surface roughness Ra of the backside conductive layer 45 is equal to or smaller than 0.25 nm. In certain embodiments, the surface roughness Ra of the backside conductive layer 45 is equal to or more than 0.05 nm. Further, in some embodiments, the flatness of the backside conductive layer 45 is equal to or less than 50 nm. In some embodiments, the flatness of the backside conductive layer 45 is more than 1 nm. A thickness of the backside conductive layer 45 is in a range from about 50 nm to about 400 nm in some embodiments. In other embodiments, the backside conductive layer 45 has a thickness of about 50 nm to about 100 nm. In certain embodiments, the thickness is in a range from about 65 nm to about 75 nm. In some embodiments, the backside conductive layer 45 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering, or any other suitable film forming method. In cases of CVD, source gases include $TaCl_5$ and $BCl_3$ in some embodiments.

FIGS. 2A and 2B to 5A and 5B show various structures of the mask blank ("A" figures) and the patterned photo mask ("B" figures).

In some embodiments, as shown in FIGS. 2A and 2B, an intermediate layer 22 is formed between the capping layer 20 and the absorber layer 25. The intermediate layer 22 functions as an etching stop layer during a patterning operation of the absorber layer, and for protecting the capping layer 20 in some embodiments. In some embodiments, the intermediate layer 22 includes Ta based compound, such as TaB, TaO, TaBO or TaBN; a Cr based compound, such as CrO, CrON or CrN; silicon; a silicon based compound (e.g., silicon oxide, SiN (Si:N is about 1:1 to about 3:4), SiON or MoSi); molybdenum; niobium; niobium oxide; ruthenium; a ruthenium based compound ($RuO_2$ or RuB); BC (atomic ratio of B and C is from about 1:1 to about 4:1); BN; CN (atomic ratio of C and N is about 1:1 to about 3:4) or a two-dimensional material, such as graphene. In some embodiments, the intermediate layer is represented by $A_xB_y$, where A is Ta and/or Cr and B is one or more of Si, O, N, Al or Ti, x:y is from about 0.2:1 to about 5:1 in some embodiments.

In other embodiments, the intermediate layer 22 includes a metal oxide, such as, niobium oxide, tantalum oxide, ruthenium oxide and/or molybdenum oxide. In other embodiments, the intermediate layer 22 includes an elemental metal (not compound), such as Mo, Ta, Cr, Ni, Co and/or Ir. In certain embodiments, the intermediate layer 22 is made of tantalum oxide ($Ta_2O_5$ or non-stoichiometric (e.g., oxygen deficient) tantalum oxide). In some embodiments, the intermediate layer 22 is made of the same as or similar material to the cover layer 27. In some embodiments, the intermediate layer 22 has a lower hydrogen diffusivity than Ru (a hydrogen barrier layer) and/or lower carbon solubility or reactivity than Ru (a protection layer from carbon or hydrocarbon contamination).

The intermediate layer 22 has a thickness of about 0.5 nm to about 5 nm in some embodiments and in other embodiments, the thickness is in a range from about 1 nm to about 3 nm. In some embodiments, the intermediate layer 22 is formed by chemical vapor deposition, plasma-enhanced chemical vapor deposition, atomic layer deposition, physical vapor deposition, or any other suitable film forming method.

In other embodiments, the intermediate layer 22 is a photo catalytic layer that can catalyze hydrocarbon residues formed on the photo mask into $CO_2$ and/or $H_2O$ upon exposure to EUV radiation. Thus, an in-situ self-cleaning of the mask surface is performed. In some embodiments, in an EUV scanner system, oxygen and hydrogen gases are injected into the EUV chamber to maintain the chamber pressure (e.g., at about 2 Pa). The chamber background gas can be a source of oxygen for the cleaning operation. In addition to the photo catalytic function, the photo catalytic layer is designed to have sufficient durability and resistance to various chemicals and various chemical processes, such as cleaning and etching. In some examples, ozonated water used to make the EUV reflective mask, in a subsequent process, damages the capping layer 20 made of Ru and results in a significant EUV reflectivity drop. In addition, after Ru oxidation, Ru oxide is easily etched away by an etchant, such as $Cl_2$ or $CF_4$ gas. In some embodiments, the photo catalytic layer includes one or more of titanium oxide ($TiO_2$), tin oxide (SnO), zinc oxide (ZnO) and cadmium sulfide (CdS). The thickness of the photo catalytic layer 22 is in a range from about 2 nm to about 10 nm in some embodiments, and is in a range from about 3 nm to about 7 nm in other embodiments. When the thickness is too thin, the photo catalytic layer may not sufficiently function as an etch stop layer. When the thickness is too large, the photo catalytic layer may absorb the EUV radiation.

Further, in some embodiments, a barrier layer 18 is formed between the multilayer 15 and the capping layer 20, and the uppermost layer of the multilayer 15 is a Si layer, which is not in contact with the capping layer 20. In some embodiments, the barrier layer 18 includes a silicon compound, such as silicon oxide, silicon nitride, SiON, SiOCN or MoSiN. In other embodiments, the barrier layer 18 includes a metal oxide, such as, niobium oxide, tantalum oxide, ruthenium oxide and/or molybdenum oxide. In other embodiments, the barrier layer 18 includes elemental metal (not compound), such as Be, Mo, Ta, Cr, Ni, Co and/or Ir. In some embodiments, the barrier layer includes BN or BC.

In some embodiments, the thickness of the barrier layer 18 is in a range from about 0.5 nm to about 5 nm, and in other embodiments, the thickness is in a range from about 1 nm to about 3 nm. In some embodiments, the barrier layer 18 is formed by chemical vapor deposition, plasma-enhanced chemical vapor deposition, atomic layer deposition, physical vapor deposition, thermal or chemical oxidation, or any other suitable film forming method.

When a capping layer 20 made of a Ru or a Ru alloy layer is in direct contact with a Si layer of the multilayer stack 15, the Ru based layer may have weak adhesion to the Si layer due to hydrogen diffusion and hydrogen piling-up at the interface between the Ru based layer and the Si layer. In the embodiments shown in FIGS. 2A and 2B, where the barrier layer 18 is inserted between the multilayer stack 15 and the capping layer 20, it is possible to maintain sufficient bonding or adhesion strength between the capping layer and the multilayer stack 15.

As shown in FIG. 2B, after the circuit pattern 42 is formed, the hard mask layer 30 is removed and thus the EUV photo mask does not include the hard mask layer.

Figure 3A:
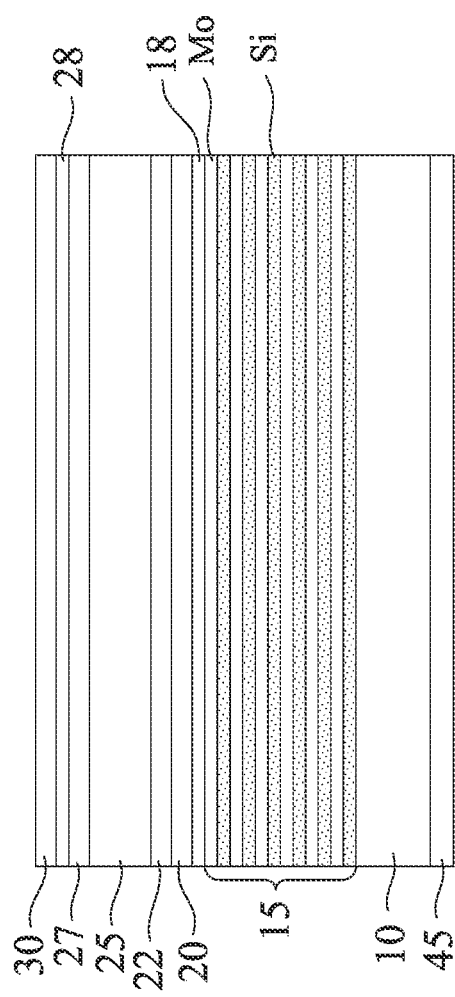
FIG. 3A shows a cross sectional view of a photo mask blank and FIG. 3B shows a cross sectional view of a photo mask according to embodiments of the present disclosure.
Figure 3B:
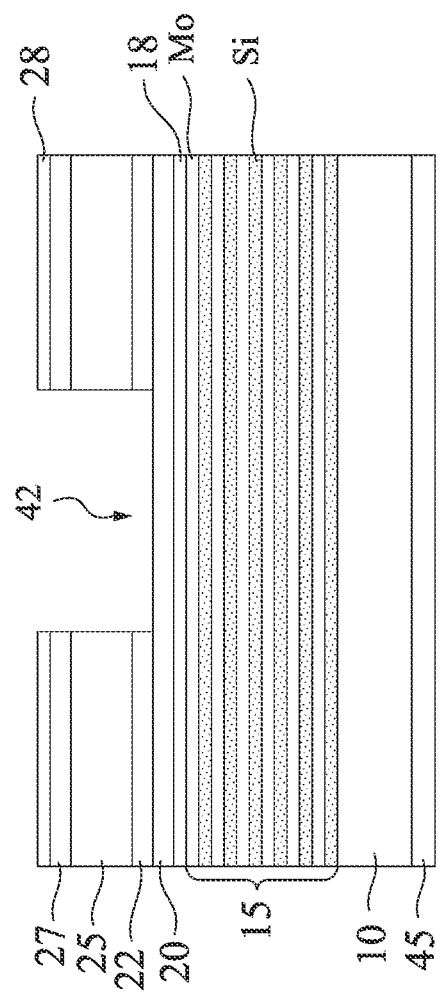

In some embodiments, as shown in FIGS. 3A and 3B, the uppermost layer of the multilayer stack 15 is a Mo layer. The remaining layer structure is the same as the layer structure as explained with respect to FIGS. 2A and 2B, and the detailed description thereon is omitted. In other words, the uppermost Si layer of the multilayer 15 is not in contact with the barrier layer 18. As shown in FIG. 3B, after the circuit pattern 42 is formed, the hard mask layer 30 is removed and thus the EUV photo mask does not include the hard mask layer.

In some embodiments, as shown in FIGS. 4A and 4B, the barrier layer 18 is not formed. The uppermost layer of the multilayer stack 15 is a Si layer. In some embodiments, the capping layer 20A is formed continuously on the multilayer stack 15 within the same film deposition apparatus. In some embodiments, an ion beam deposition process is used to form the multilayer stack 15 and the capping layer 20A by changing target material. The continuously formed capping layer 20A has a higher adhesion strength to the multilayer stack 15 than the case where the capping layer is formed by a different deposition apparatus, or the multilayer stack 15 is exposed to the atmosphere before the capping layer 20A is formed. The remaining layer structure is the same as the layer structure as explained with respect to FIGS. 2A and 2B, and the detailed description thereon is omitted.

In some embodiments, as shown in FIGS. 5A and 5B, the barrier layer 18 is not formed, and the uppermost layer of the multilayer stack 15 is a Mo layer. In some embodiments, the capping layer 20A is formed continuously on the multilayer stack 15 within the same film deposition apparatus, as set forth above. When a capping layer made of a Ru or a Ru alloy layer is in direct contact with a Si layer of the multilayer stack 15, the Ru based layer may have weak adhesion to the Si layer due to hydrogen diffusion and hydrogen piling-up at the interface between the Ru based layer and the Si layer. In some embodiments shown in FIGS. 5A and 5B, where the multilayer stack 15 is terminated by a Mo layer, sufficient bonding or adhesion strength is maintained between the capping layer and the multilayer stack 15.

FIGS. 6A, 6B and 6C show cross sectional views of an absorber layer of a photo mask according to embodiments of the present disclosure.

The configuration of the absorber layer 25 is not limited to the foregoing embodiments. In FIG. 6A, the absorber layer 25 is a single layer. In some embodiments, the absorber layer is a bilayer of a lower layer 25A and an upper layer 25B, as shown in FIG. 6B. Any combination of the two materials as explained above can be used for the lower layer 25A and the upper layer 25B. In certain embodiments, one of the lower layer and the upper layer is a Ru based material as listed above, and the other one is an Ir based material as listed above. The thickness of the lower layer 25A may be the same as or different (smaller or larger) than the thickness of the upper layer 25B.

In other embodiments, as shown in FIG. 6C, the absorber layer 25M has a multilayer structure (more than two layers and equal to or less than 10 layers). In some embodiments, two materials are alternately stacked in the absorber layer 25M, and in other embodiments, three or more materials are used. In the case where two materials are used, the two materials have the same as or similar configuration to the bilayer of FIG. 6B.

FIGS. 7A-7F and 8A-8F schematically illustrate a method of fabricating an EUV photo mask for use in extreme ultraviolet lithography (EUVL). It is understood that additional operations can be provided before, during, and after processes shown by FIGS. 7A-8F, and some of the operations described below can be replaced or eliminated for additional embodiments of the method. The order of the operations/processes may be interchangeable. In FIGS. 7A-7F and 8A-8F, the optional protection layer 28 and the barrier layer 18 are omitted for simplicity. Further, the uppermost layer of the multilayer stack can be a Mo layer.

Figure 7A:
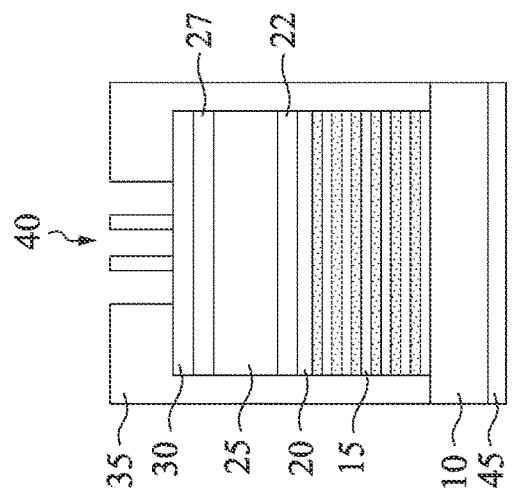
FIGS. 7A, 7B, 7C, 7D, 7E and 7F schematically illustrate a method of fabricating an EUV photo mask according to an embodiment of the present disclosure.
Figure 7B:
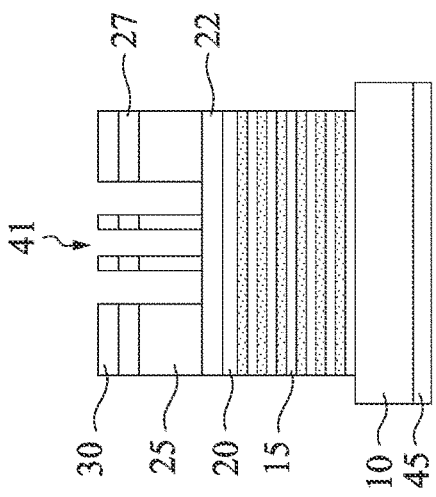
Figure 7C:
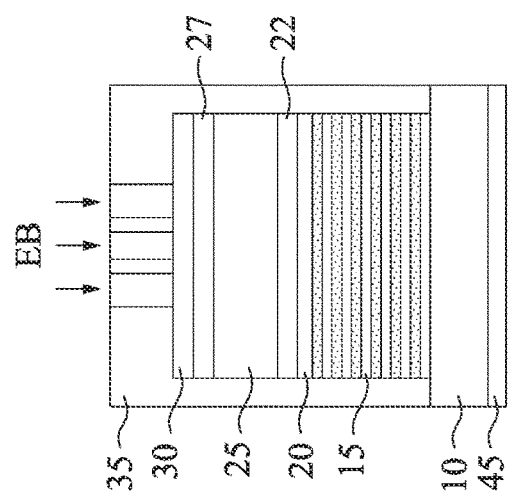

In the fabrication of an EUV photo mask, a first photoresist layer 35 is formed over the hard mask layer 30 of the EUV photo mask blank as shown in FIG. 7A, and the photoresist layer 35 is selectively exposed to actinic radiation EB as shown in FIG. 7B. Before the first photoresist layer 35 is formed, the EUV photo mask blank is subject to inspection in some embodiments. The selectively exposed first photoresist layer 35 is developed to form a pattern 40 in the first photoresist layer 35 as shown in FIG. 7C. In some embodiments, the actinic radiation EB is an electron beam or an ion beam. In some embodiments, the pattern 40 corresponds to a pattern of semiconductor device features for which the EUV photo mask will be used to form in subsequent operations.

Figure 7D:
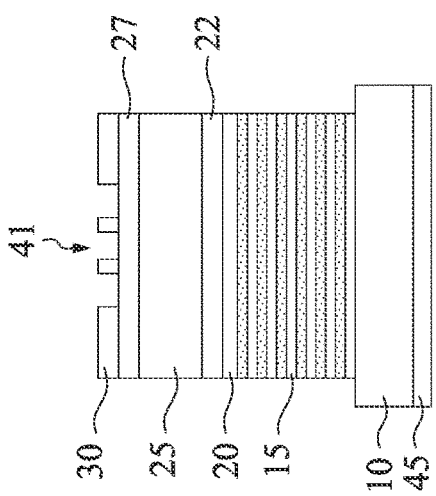
Figure 7E:
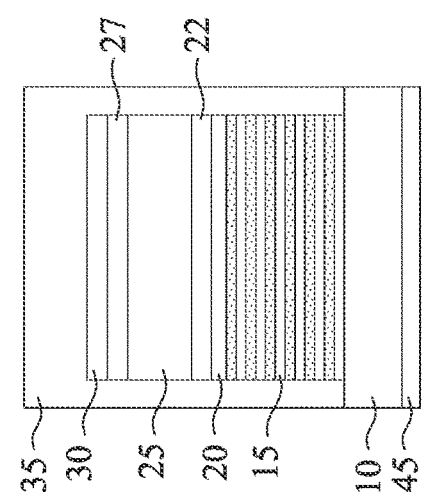

Next, the pattern 40 in the first photoresist layer 35 is extended into the hard mask layer 30 forming a pattern 41 in the hard mask layer 30 exposing portions of the cover layer 27, as shown in FIG. 7D. The pattern 41 extended into the hard mask layer 30 is formed by etching, in some embodiments, using a suitable wet or dry etchant that is selective to the cover layer 27. After the pattern 41 in the hard mask layer 30 is formed, the first photoresist layer 35 is removed by a photoresist stripper to expose the upper surface of the hard mask layer 30, as shown in FIG. 7E.

Figure 7F:
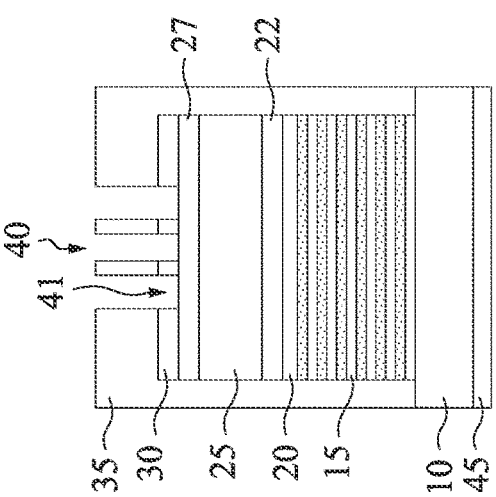
Figure 8C:
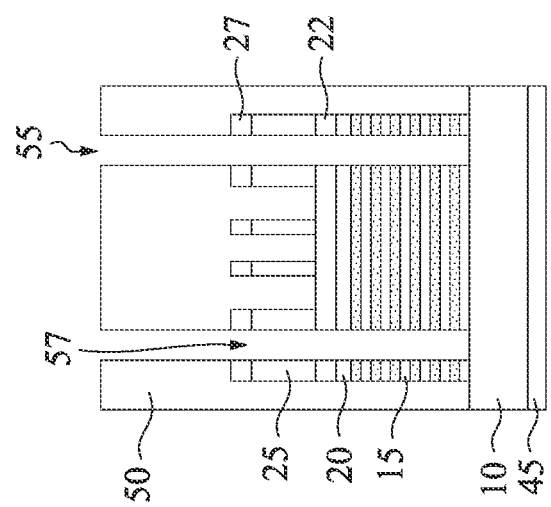
FIGS. 8A, 8B, 8C and 8D schematically illustrate a method of fabricating an EUV photo mask according to an embodiment of the present disclosure.
Figure 8B:
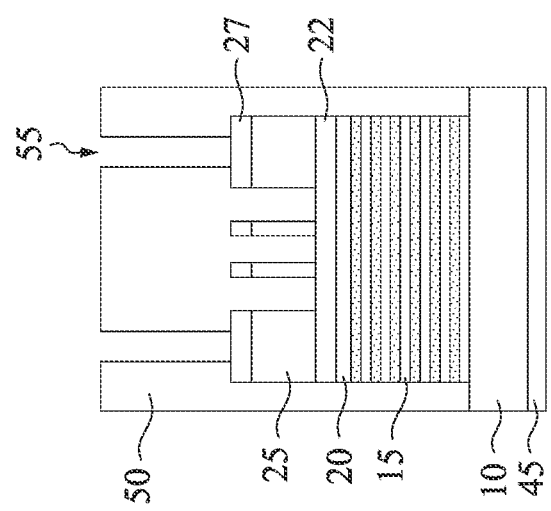
Figure 8A:
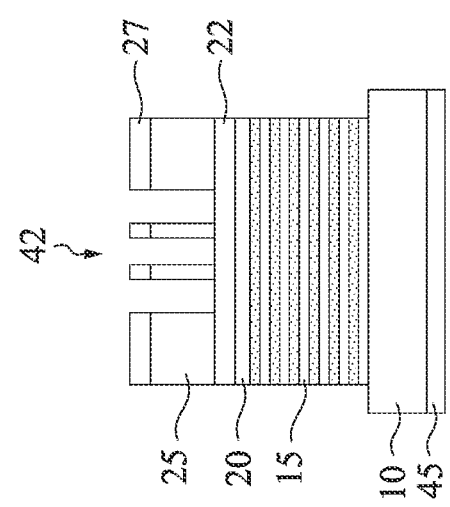

Then, the pattern 41 in the hard mask layer 30 is extended into the cover layer 27 and the absorber layer 25, thereby forming a pattern 42 (see, FIG. 8A) in the cover layer 27 and the absorber layer 25 exposing portions of the intermediate layer 22, as shown in FIG. 7F, and then the hard mask layer 30 is removed as shown in FIG. 8A. The pattern 42 extended into the cover layer 27 and the absorber layer 25 is formed by etching, in some embodiments, using a suitable wet or dry etchant that is selective to the intermediate layer 22. In some embodiments, plasma dry etching is used. In some embodiments, when the intermediate layer 22 is made of the same material as or similar material to the hard mask layer 30, or when the intermediate layer 22 and the hard mask layer 30 have similar etching resistivity to the etching of the absorber layer 25, the etching substantially stops at the intermediate layer 22. In some embodiments, the cover layer 27 is patterned by using the patterned hard mask layer 30, and then the absorber layer 25 is patterned by using the patterned cover layer 27 as an etching mask with or without the hard mask layer 30 (i.e.—the cover layer functions as a hard mask).

As shown in FIG. 8B, a second photoresist layer 50 is formed over the absorber layer 25 filling the pattern 42 in the cover layer 27 and the absorber layer 25. The second photoresist layer 50 is selectively exposed to actinic radiation such as electron beam, ion beam or UV radiation. The selectively exposed second photoresist layer 50 is developed to form a pattern 55 in the second photoresist layer 50 as shown in FIG. 8B. The pattern 55 corresponds to a black border surrounding the circuit patterns. A black border is a frame shape area created by removing all the multilayers on the EUV photo mask in the region around a circuit pattern area. It is created to prevent exposure of adjacent fields when printing an EUV photo mask on a wafer. The width of the black border is in a range from about 1 mm to about 5 mm in some embodiments.

Next, the pattern 55 in the second photoresist layer 50 is extended into the cover layer 27, the absorber layer 25, capping layer 20, and Mo/Si multilayer stack 15 forming a pattern 57 (see, FIG. 8D) in the absorber layer 25, capping layer 20, and Mo/Si multilayer stack 15 exposing portions of the substrate 10, as shown in FIG. 8C. The pattern 57 is formed by etching, in some embodiments, using one or more suitable wet or dry etchants that are selective to each of the layers that are etched. In some embodiments, plasma dry etching is used.

Figure 8D:
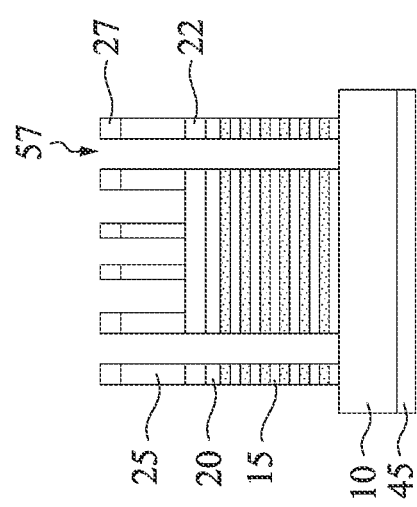

Then, the second photoresist layer 50 is removed by a suitable photoresist stripper to expose the upper surface of the absorber layer 25 as shown in FIG. 8D. The black border pattern 57 in the cover layer 27, the absorber layer 25, capping layer 20, and the Mo/Si multilayer stack 15 defines a black border of the photo mask in some embodiments of the disclosure.

FIGS. 9A and 9B show cross sectional views of EUV reflective photo mask according to embodiments of the present disclosure. Materials, configurations, processes and/or dimensions as explained with respect to the foregoing embodiments may be employed in the following embodiments and detailed description thereof may be omitted.

In the embodiments of FIGS. 9A and 9B, an absorber layer is embedded in a multilayer reflective layer.

As shown in FIG. 9A, an additional upper multilayer reflective layer 56 is formed on an intermediate layer 22. The structure of the upper multilayer reflective layer 56 is the same as that of the multilayer structure 15 as explained above. In some embodiments, the number of pairs of a Si layer and a Mo layer (or a pair of a Mo layer and a Be layer) of the upper multilayer reflective layer 56 is equal to or smaller than that of the multilayer structure 15 and is in a range from about 20 to about 40. An upper barrier layer 48 is formed on the upper multilayer reflective layer 56. The material of the upper barrier layer 48 has the same or similar configuration as the barrier layer 18, and includes one or more of the materials as explained above with respect to the barrier layer 18. In some embodiments, at least one of the barrier layer 18 or the upper barrier layer 48 is not formed.

Further, in some embodiments, an upper capping layer 51 is formed on the upper barrier layer. The material of the upper capping layer 51 has the same or similar configuration as the capping layer 20, and includes one or more of the materials as explained above with respect to the capping layer 20. In some embodiments, an upper etch stop layer 52 is formed on the upper capping layer. The material of the upper etch stop layer 52 has the same or similar configuration as the intermediate (etch stop) layer 22, and includes one or more of the materials as explained above with respect to the intermediate layer 22.

In some embodiments, an absorber layer 80 is formed in a trench corresponding to a circuit pattern formed in the upper etch stop layer 52, the upper capping layer 51 and the upper multilayer reflective layer 56, as shown in FIG. 9A. The material of the absorber layer 80 has the same or similar configuration as the absorber layer 25 (see, FIGS. 2A-6C), and includes one or more of the materials as explained above with respect to the absorber layer 25. In some embodiments, an antireflective layer 82 is formed on the absorber layer 25. The material of the antireflective layer 82 has the same or similar configuration as the antireflective layer 27 (see, FIGS. 2A-6C), and includes one or more of the materials as explained above with respect to the antireflective layer 27. In some embodiments, an antireflective layer is not formed. Further, in some embodiments, a protective layer 85 is formed over the upper etch stop layer 52 and the antireflective layer 82 if it exists. The material of the protective layer 85 has the same or similar configuration as the protective layer 28 (see, FIGS. 2A-6C), and includes one or more of the materials as explained above with respect to the protective layer 28. In some embodiments, one or more layers of the upper barrier layer 48, the upper capping layer 51 and the upper etch stop layer 52 are not formed.

In FIG. 9B, an absorber layer 80 is at least partially embedded in the multilayer structure 15. In some embodiments, the bottom of the absorber layer 80 is spaced apart from the substrate 10, and in other embodiments, the bottom of the absorber layer 80 is in contact with the substrate 10. As shown in FIG. 9B, in some embodiments, a protective layer 85 is formed over the intermediate layer 22 and the antireflective layer 82, if it exists 56.

FIGS. 10A-10D, 11A-11D and 12A-12B schematically illustrate a method of fabricating the EUV photo mask as shown in FIG. 9A. It is understood that additional operations can be provided before, during, and after processes shown by FIGS. 10A-12B, and some of the operations described below can be replaced or eliminated for additional embodiments of the method. The order of the operations/processes may be interchangeable. Materials, configurations, processes and/or dimensions as explained with respect to the foregoing embodiments may be employed in the following embodiments and detailed description thereof may be omitted.

Figure 10D:
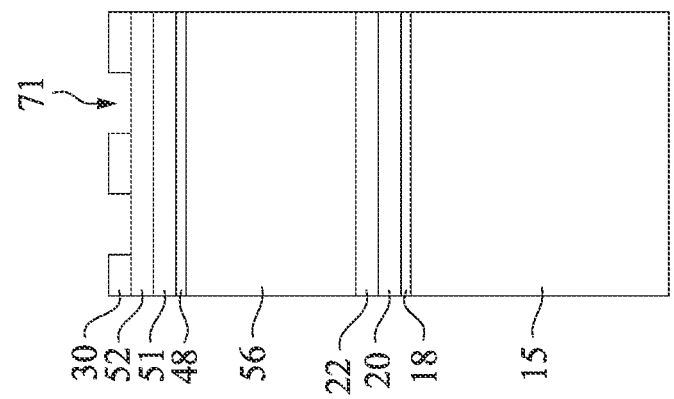
FIGS. 10A, 10B, 10C and 10D schematically illustrate a method of fabricating an EUV photo mask according to an embodiment of the present disclosure.
Figure 10C:
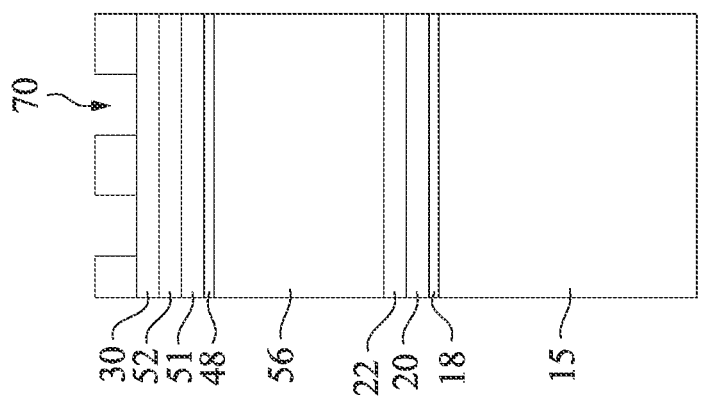
Figure 10B:
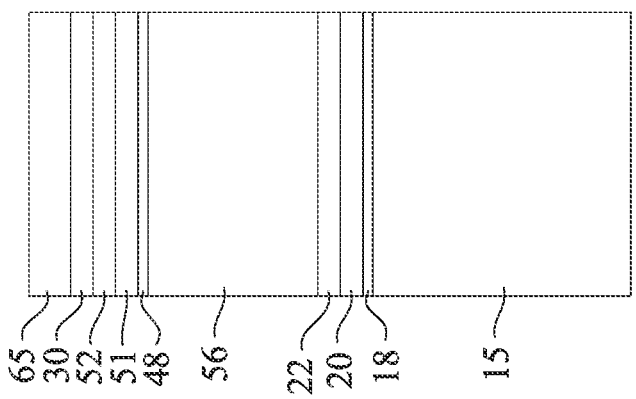
Figure 10A:
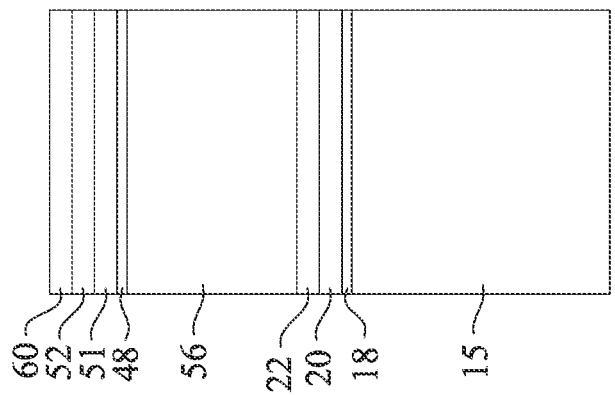

FIG. 10A shows a mask blank structure. A hard mask layer 30 is formed on the upper etch stop layer 52. A first photoresist layer 65 is formed over the hard mask layer 30 of the EUV photo mask blank as shown in FIG. 10B. The first photoresist layer 65 is selectively exposed to actinic radiation (e.g., electron beam), and the selectively exposed first photoresist layer 65 is developed to form a pattern 70 in the photoresist layer 65 as shown in FIG. 10C.

Next, the pattern 70 in the photoresist layer 65 is extended into the hard mask layer 30 forming a pattern 71 in the hard mask layer 30 exposing portions of the upper etch stop layer 52, as shown in FIG. 10D. The pattern 71 extended into the hard mask layer 30 is formed by etching, in some embodiments, using a suitable wet or dry etchant that is selective to the upper etch stop layer 52. After the pattern 71 in the hard mask layer 30 is formed, the photoresist layer 65 is removed by a photoresist stripper to expose the upper surface of the hard mask layer 30, as shown in FIG. 10D.

Figure 11D:
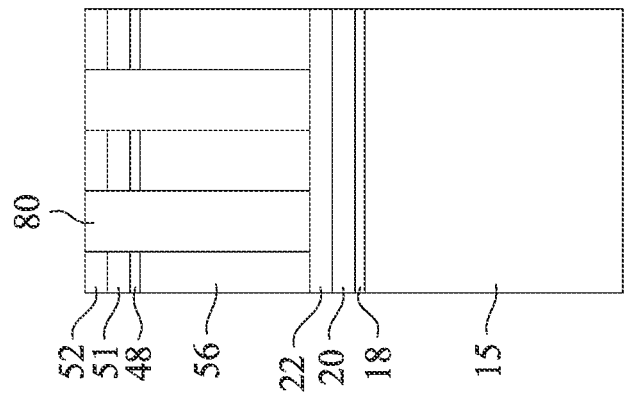
FIGS. 11A, 11B, 11C and 11D schematically illustrate a method of fabricating an EUV photo mask according to an embodiment of the present disclosure.
Figure 11C:
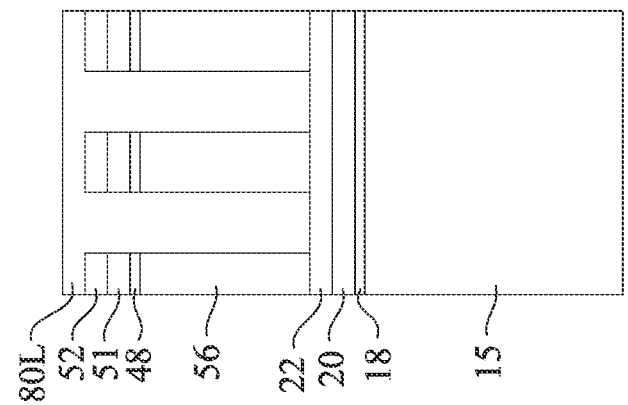
Figure 11B:
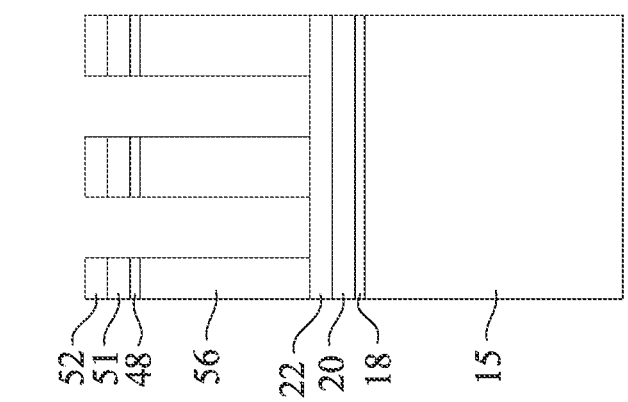
Figure 11A:
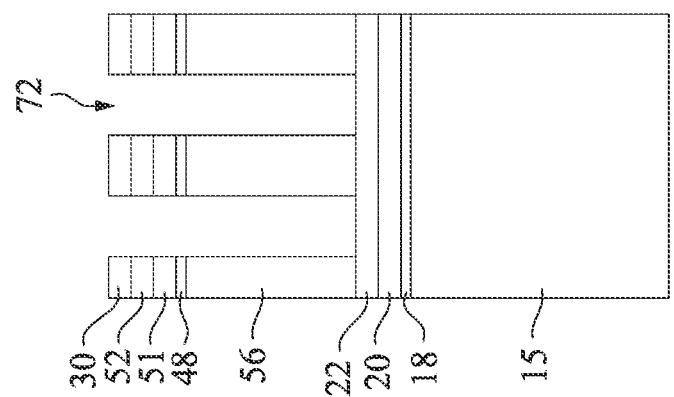

Then, the pattern 71 in the hard mask layer 30 is extended into the upper etch stop layer 52, the upper capping layer 51, the upper barrier layer 48 and the upper multilayer structure 56, thereby forming a trench pattern 72, as shown in FIG. 11A. In some embodiments, the trench etching stops at the intermediate (etch stop) layer 22. Then, the hard mask layer 30 is removed as shown in FIG. 11B.

Next, as shown in FIG. 11C, one or more layers 80L for the absorber layer 80 is formed in the trench pattern 72 and over the upper etch stop layer 52. Then, a planarization operation, such as a chemical mechanical polishing (CMP) operation, is performed to remove excess material on the upper etch stop layer 52 to form the absorber layer (pattern) 80, as shown in FIG. 11D. In some embodiments, the hard mask layer is not removed before forming the layer 80L and is removed after or during the CMP operation.

Figure 12A:
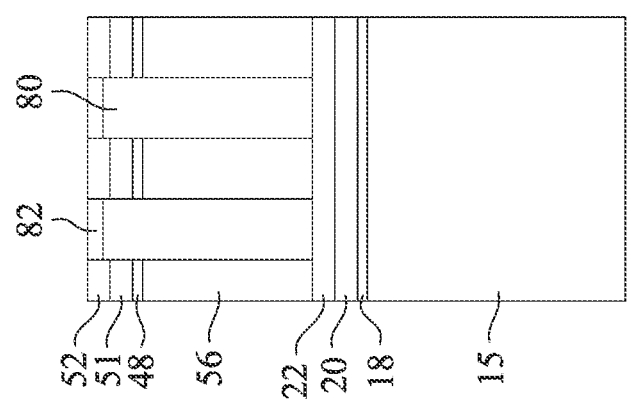
FIGS. 12A and 12B schematically illustrate a method of fabricating an EUV photo mask according to an embodiment of the present disclosure.
Figure 12B:
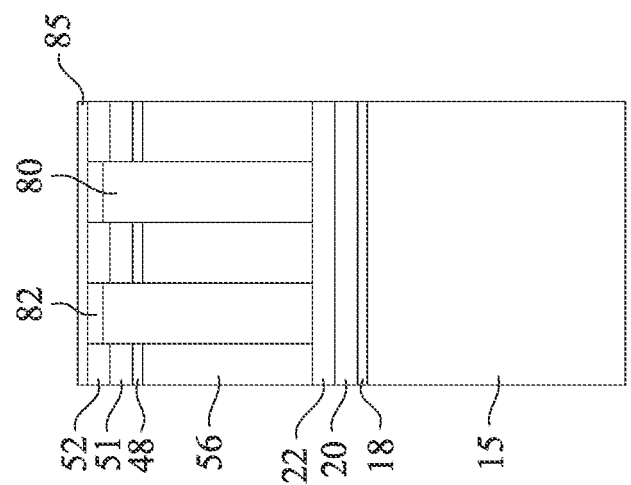

Then, in some embodiments, an antireflective layer 82 is formed on the absorber layer 80. When the absorber layer 80 is made of a Ta based material, the antireflective layer 82 is formed by oxidation of the absorber layer 80. Subsequently, a protection layer 85 is formed over the antireflective layer 82 and the upper etch stop layer 52, as shown in FIG. 12B. Further, similar to the operations as explained with FIGS. 8B-8D, a black border pattern is formed.

Figure 13:
FIG. 13 shows a flowchart of a method making an EUV photo mask blank.

FIG. 13 shows a flow chart of manufacturing a mask blank of one or more of the foregoing embodiments. It is understood that additional operations can be provided before, during, and after process steps shown in FIG. 13, and some of the operations described below can be replaced or eliminated for additional embodiments of the method. The order of the operations/processes may be interchangeable.

At S101, a multilayer stack is formed on a substrate. In some embodiments, one or more layers are formed on the substrate before forming the multilayer stack. In some embodiments, the multilayer stack is formed by an ion beam deposition method or a sputtering method. In some embodiments, the multilayer stack is terminated with a Si layer and in other embodiments, the multilayer stack is terminated with a Mo layer. At S102, a barrier layer is formed on the multilayer stack. Then, at S103, a capping layer is formed on the barrier layer.

In some embodiments, no barrier layer is formed, and the capping layer is formed directly on the multilayer stack. In some embodiments, the capping layer is continuously formed on the multilayer stack by an ion beam deposition method in the same deposition apparatus as for the multilayer stack.

At S104, an intermediate (barrier) layer is formed on the capping layer. At S105, one or more absorber layers are formed on the intermediate layer. At S106, a cover (antireflective) layer is formed on the absorber layer. In some embodiments, the absorber layer is formed by a deposition method, and in other embodiments, the absorber layer is formed by oxidation of a Ta based absorber layer. At S107, a protection layer is formed on the cover layer, and at S108, a hard mask layer is formed on the protection layer.

In the manufacturing a mask blank for the photo mask shown in FIG. 9A, the operations S101-S104 are repeated twice and the operations S105-S107 are skipped.

FIG. 14A shows a flowchart of a method of making a semiconductor device, and FIGS. 14B, 14C, 14D and 14E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S201 of FIG. 14A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S202 of FIG. 14A, a photo resist layer is formed over the target layer, as shown in FIG. 14B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable techniques. The coated photo resist layer may be further baked to drive out solvent in the photo resist layer. At S203 of FIG. 14A, the photoresist layer is patterned using an EUV reflective mask as set forth above, as shown in FIG. 14B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

At S204 of FIG. 14A, the target layer is patterned utilizing the patterned photoresist layer as an etching mask, as shown in FIG. 14D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 14E.

In the present disclosure, where a high EUV absorption material (e.g., an Jr, Pt and/or Ru based material) is used as an absorber layer, it is possible to obtain a high contrast EUV reflective mask. Further, it is possible to reduce a thickness of the absorption layer, which can reduce a three-dimensional effect of the absorber layer. In addition, in some embodiments of the present disclosure, a barrier layer is disposed under the capping layer, which prevents hydrogen diffusion in the EUV mask together with the intermediate layer. Moreover, in some embodiments of the present disclosure, the multilayer is terminated by an Mo layer, which prevents peeling-off of the capping layer from the multilayer.

It will be understood that not all advantages have been necessarily discussed herein, no particular advantage is required for all embodiments or examples, and other embodiments or examples may offer different advantages.

According to one aspect of the present application, a reflective mask includes a substrate, a reflective multilayer disposed over the substrate, a capping layer disposed over the reflective multilayer, an intermediate layer disposed over the capping layer, an absorber layer disposed over the intermediate layer, and a cover layer disposed over the absorber layer. The absorber layer includes one or more layers of an Ir based material, a Pt based material or a Ru based material. In one or more of the foregoing and following embodiments, the absorber layer includes two layers made of different materials from each other. In one or more of the foregoing and following embodiments, the absorber layer includes three or more layers. In one or more of the foregoing and following embodiments, the cover layer is made of a same material as the intermediate layer. In one or more of the foregoing and following embodiments, the intermediate layer and the cover layer includes metal oxide. In one or more of the foregoing and following embodiments, the reflective mask further includes an opening pattern formed in the cover layer and the absorber layer, and the intermediate layer is exposed at a bottom of the opening pattern. In one or more of the foregoing and following embodiments, the reflective multilayer include Si layers and Mo layers alternately stacked, and a Si layer of the reflective multilayer is in contact with the capping layer. In one or more of the foregoing and following embodiments, the reflective multilayer include Si layers and Mo layers alternately stacked, and a Mo layer of the reflective multilayer is in contact with the capping layer.

In accordance with another aspect of the present disclosure, a reflective mask includes a substrate, a reflective multilayer disposed on the substrate, a barrier layer disposed on the reflective multilayer, a capping layer disposed over the barrier layer, an intermediate layer disposed over the capping layer, an absorber layer disposed over the intermediate layer, and a cover layer disposed over the absorber layer. The barrier layer includes one or more of silicon nitride, BC, BN, CN or graphene. In one or more of the foregoing and following embodiments, the absorber layer includes one or more layers of an Ir based material, a Pt based material or a Ru based material. In one or more of the foregoing and following embodiments, the one or more layers of an Ir based material, a Pt based material or a Ru based material further include one or more of Si, B or N. In one or more of the foregoing and following embodiments, the absorber layer includes $A_xB_y$, where A and B are each one or more of Jr, Pt, Ru, Cr, Ta, Os, Pd, Al or Re, and x:y is from 0.25:1 to 4:1. In one or more of the foregoing and following embodiments, the absorber layer further includes one or more of Si, B, or N in an amount of more than zero to 10 atomic %. In one or more of the foregoing and following embodiments, the intermediate layer includes a material having a lower hydrogen diffusivity than a material of the capping layer. In one or more of the foregoing and following embodiments, the intermediate layer includes one or more of BC, BN, CN or graphene. In one or more of the foregoing and following embodiments, the capping layer includes $Ru_xM_{1-x}$, where M is one or more of Nb, Jr, Rh, Zr, Ti, B, P, V, Os, Pd, Pt or Re, x is more than zero and equal to or less than about 0.5.

In accordance with another aspect of the present disclosure, a reflective mask, includes a substrate, a first reflective multilayer disposed over the substrate, a first capping layer disposed over the first reflective multiplayer, a first etch stop layer disposed over the first capping layer, a second reflective multilayer disposed over the first etch stop layer, a second capping layer disposed over the second reflective multiplayer, a second etch stop layer disposed over the second capping layer, and an absorber layer disposed in a trench formed in the second etch stop layer, the second capping layer and the second reflective multilayer. In one or more of the foregoing and following embodiments, the reflective mask further includes a protective layer disposed over the absorber layer and the second etch stop layer. In one or more of the foregoing and following embodiments, the reflective mask further includes an antireflective layer between the protective layer and the absorber layer. In one or more of the foregoing and following embodiments, a number of pairs of a Si layer and a Mo layer in the second multilayer is equal to or smaller than a number of pairs of a Si layer and a Mo layer in the first multilayer.

In accordance with another aspect of the present disclosure, in a method of manufacturing a reflective mask, a photo resist layer is formed over a mask blank. The mask blank includes a substrate, a reflective multilayer disposed over the substrate, a capping layer disposed over the reflective multilayer, an intermediate layer disposed over the capping layer, an absorber layer disposed over the intermediate layer, a cover layer disposed over the absorber layer and a hard mask layer disposed over the cover layer. The photo resist layer is patterned, the hard mask layer is patterned by using the patterned photo resist layer, the cover layer and the absorber layer are patterned by using the patterned hard mask layer to form an opening, and the hard mask layer is removed. The absorber layer includes $A_xB_y$, where A and B are each one or more of Ir, Pt, Ru, Cr, Ta, Os, Pd, Al or Re, and x:y is from 0.25:1 to 4:1. In one or more of the foregoing and following embodiments, the intermediate layer functions as an etch stop layer in the patterning the absorber layer. In one or more of the foregoing and following embodiments, the cover layer is made of a same material as the intermediate layer. In one or more of the foregoing and following embodiments, the absorber layer includes two layers made of different materials from each other. In one or more of the foregoing and following embodiments, the absorber layer includes three or more layers. In one or more of the foregoing and following embodiments, the reflective multilayer include Si layers and Mo layers alternately stacked, and a Si layer of the reflective multilayer is in contact with the capping layer. In one or more of the foregoing and following embodiments, the reflective multilayer include Si layers and Mo layers alternately stacked, and a Mo layer of the reflective multilayer is in contact with the capping layer. In one or more of the foregoing and following embodiments, the capping layer is continuously formed by an ion beam deposition method in a same deposition apparatus as the reflective multilayer.

In accordance with another aspect of the present disclosure, in a method of manufacturing a reflective mask, a photo resist layer is formed over a mask blank. The mask blank includes a substrate, a reflective multilayer disposed over the substrate, a barrier layer disposed over the reflective multilayer, a capping layer disposed over the barrier layer, an intermediate layer disposed over the capping layer, an absorber layer disposed over the intermediate layer, a cover layer disposed over the absorber layer and a hard mask layer disposed over the cover layer. The photo resist layer is patterned, the hard mask layer is patterned by using the patterned photo resist layer, the cover layer and the absorber layer are patterned by using the patterned hard mask layer to form an opening, and the hard mask layer is removed. The barrier layer includes one or more of silicon nitride, BC, BN, CN or graphene. In one or more of the foregoing and following embodiments, the absorber layer includes $A_xB_y$, where A and B are each one or more of Jr, Pt, Ru, Cr, Ta, Os, Pd, Al or Re, and x:y is from 0.25:1 to 4:1. In one or more of the foregoing and following embodiments, the absorber layer includes one or more layers of an Ir based material, a Pt based material or a Ru based material. In one or more of the foregoing and following embodiments, the absorber layer further includes one or more of Si, B, or N in an amount of more than zero to 10 atomic %. In one or more of the foregoing and following embodiments, the intermediate layer includes a material having a lower hydrogen diffusivity than a material of the capping layer. In one or more of the foregoing and following embodiments, the intermediate layer includes one or more of BC, BN, CN or graphene. In one or more of the foregoing and following embodiments, a thickness of the intermediate layer is in a range from 0.5 nm to 3 nm.

In accordance with another aspect of the present disclosure, in a method of manufacturing a reflective mask, a photo resist layer is formed over a mask blank. The mask blank includes a substrate, a first reflective multilayer disposed over the substrate, a first capping layer disposed over the first reflective multiplayer, a first etch stop layer disposed over the first capping layer, a second reflective multilayer over the first etch stop layer, a second capping layer disposed over the second reflective multiplayer, a second etch stop layer disposed over the second capping layer, and a hard mask layer on the second etch stop layer. The photo resist layer is patterned, the hard mask layer is patterned by using the patterned photo resist layer, the second etch stop layer, the second capping layer and the second absorber layer are patterned by using the patterned hard mask layer to form a trench, and an absorber layer is formed by filling the trench with an EUV absorbing material. In one or more of the foregoing and following embodiments, a protection layer is further formed over the absorber layer and the second etch stop layer. In one or more of the foregoing and following embodiments, in the forming the absorber layer, a layer of the EUV absorbing material is formed in the trench and over the second etch stop layer, and a chemical mechanical polishing is performed to expose the second etch stop layer. In one or more of the foregoing and following embodiments, an antireflective layer is formed on the absorber layer. In one or more of the foregoing and following embodiments, the antireflective layer is formed by oxidizing a part of the absorber layer.

In accordance with another aspect of the present disclosure, in a method of manufacturing a reflective mask blank, a reflective multilayer is formed over a the substrate, a capping layer is formed over the reflective multilayer, an intermediate layer is formed over the capping layer, an absorber layer is formed over the intermediate layer, and a hard mask layer is formed over the absorber layer. The capping layer is continuously formed by an ion beam deposition method in a same deposition apparatus as the reflective multilayer. In one or more of the foregoing and following embodiments, the absorber layer includes one or more layers of an Ir based material, a Pt based material or a Ru based material. In one or more of the foregoing and following embodiments, the absorber layer includes two layers made of different materials from each other. In one or more of the foregoing and following embodiments, the absorber layer includes three or more layers. In one or more of the foregoing and following embodiments, the cover layer is made of a same material as the intermediate layer. In one or more of the foregoing and following embodiments, the intermediate layer and the cover layer includes metal oxide. In one or more of the foregoing and following embodiments, an antireflective layer is formed over the absorber layer. In one or more of the foregoing and following embodiments, the reflective multilayer include Si layers and Mo layers alternately stacked, and a Si layer of the reflective multilayer is in contact with the capping layer. In one or more of the foregoing and following embodiments, the reflective multilayer include Si layers and Mo layers alternately stacked, and a Mo layer of the reflective multilayer is in contact with the capping layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reflective mask, comprising:
a substrate;
a reflective multilayer disposed over the substrate;
a capping layer disposed over the reflective multilayer;
an intermediate layer disposed over the capping layer;
an absorber layer disposed over the intermediate layer; and
a cover layer disposed over the absorber layer,
wherein the absorber layer includes one or more layers of an Ir based material, a Pt based material or a Ru based material.

2. The reflective mask of claim 1, wherein the absorber layer includes two layers made of different materials from each other.

3. The reflective mask of claim 1, wherein the absorber layer includes three or more layers.

4. The reflective mask of claim 1, wherein the cover layer is made of a same material as the intermediate layer.

5. The reflective mask of claim 4, wherein the intermediate layer and the cover layer include metal oxide.

6. The reflective mask of claim 1, further comprising an opening pattern formed in the cover layer and the absorber layer,
wherein the intermediate layer is exposed at a bottom of the opening pattern.

7. The reflective mask of claim 1, wherein:
the reflective multilayer include Si layers and Mo layers alternately stacked, and
a Si layer of the reflective multilayer is in contact with the capping layer.

8. The reflective mask of claim 1, wherein:
the reflective multilayer include Si layers and Mo layers alternately stacked, and
a Mo layer of the reflective multilayer is in contact with the capping layer.

9. A reflective mask, comprising:
a substrate;
a reflective multilayer disposed over the substrate;
a barrier layer disposed over the reflective multilayer;
a capping layer disposed over the barrier layer;
an intermediate layer disposed over the capping layer;
an absorber layer disposed over the intermediate layer; and
a cover layer disposed over the absorber layer,
wherein the barrier layer includes one or more of silicon nitride, BC, BN, CN or graphene.

10. The reflective mask of claim 9, wherein the absorber layer includes one or more layers of an Ir based material, a Pt based material or a Ru based material.

11. The reflective mask of claim 10, wherein the one or more layers of an Ir based material, a Pt based material or a Ru based material further include one or more of Si, B or N.

12. The reflective mask of claim 9, wherein the absorber layer includes $A_xB_y$, where A and B are each one or more of Ir, Pt, Ru, Cr, Ta, Os, Pd, Al or Re, and x:y is from 0.25:1 to 4:1.

13. The reflective mask of claim 12, wherein the absorber layer further includes one or more of Si, B, or N in an amount of more than zero to 10 atomic %.

14. The reflective mask of claim 9, wherein the intermediate layer includes a material having a lower hydrogen diffusivity than a material of the capping layer.

15. The reflective mask of claim 9, wherein the intermediate layer includes one or more of BC, BN, CN or graphene.

16. The reflective mask of claim 9, wherein the capping layer includes $Ru_xM_{1-x}$, where M is one or more of Nb, Ir, Rh, Zr, Ti, B, P, V, Os, Pd, Pt or Re, x is more than zero and equal to or less than about 0.5.

17. A reflective mask, comprising:
a substrate;
a first reflective multilayer disposed over the substrate;
a first capping layer disposed over the first reflective multilayer;
a first etch stop layer disposed over the first capping layer;
a second reflective multilayer disposed over the first etch stop layer;
a second capping layer disposed over the second reflective multilayer;
a second etch stop layer disposed over the second capping layer; and
an absorber layer disposed in a trench formed in the second etch stop layer, the second capping layer and the second reflective multilayer.

18. The reflective mask of claim 17, further comprising a protective layer disposed over the absorber layer and the second etch stop layer.

19. The reflective mask of claim 18, further comprising an antireflective layer between the protective layer and the absorber layer.

20. The reflective mask of claim 17, wherein a number of pairs of a Si layer and a Mo layer in the second multilayer is equal to or smaller than a number of pairs of a Si layer and a Mo layer in the first multilayer.

* * * * *